(12) United States Patent
Narendra et al.

(10) Patent No.: US 7,050,291 B2
(45) Date of Patent: May 23, 2006

(54) INTEGRATED ULTRACAPACITOR AS ENERGY SOURCE

(75) Inventors: Siva G. Narendra, Portland, OR (US); Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 70 days.

(21) Appl. No.: 10/813,112

(22) Filed: Mar. 31, 2004

(65) Prior Publication Data

US 2005/0219796 A1    Oct. 6, 2005

(51) Int. Cl.
*H01G 9/00* (2006.01)

(52) U.S. Cl. .................. 361/502; 361/328; 361/522; 257/532

(58) Field of Classification Search ........... 361/502, 361/511–512, 303, 306.2, 306.3, 328–329, 361/522; 257/532, 303, 306, 309–310
See application file for complete search history.

(56) References Cited

U.S. PATENT DOCUMENTS

| | | | | |
|---|---|---|---|---|
| 5,086,373 A | * | 2/1992 | Kurabayashi et al. | 361/502 |
| 6,195,249 B1 | * | 2/2001 | Honda et al. | 361/306.3 |
| 6,483,691 B1 | * | 11/2002 | Nakamura | 361/303 |
| 6,558,437 B1 | * | 5/2003 | Wei et al. | 29/25.03 |

OTHER PUBLICATIONS http://www.maxwell.com/ultracapacitors/index.html.
David Linden (editor), Thomas B. Reddy (editor), *Handbook of Batteries*, McGraw-Hill Professional, 3rd Edition, Chapters 42 and 43, Aug. 30, 2001.

* cited by examiner

*Primary Examiner*—Anthony Dinkins
(74) *Attorney, Agent, or Firm*—Fleshner & Kim, LLP

(57) ABSTRACT

An ultracapacitor formed on a semiconductor substrate includes a plurality conductive layers with intervening dielectric layers. These layers form a plurality of capacitors which may be connected in parallel to store a charge for powering an electronic circuit or for performing a variety of integrated circuit applications. A plurality of ultracapacitors of this type may be connected in series or may be designed in stacked configuration for attaining a specific charge distribution profile.

21 Claims, 17 Drawing Sheets

$Q_{TOTAL} = Q_1 + Q_2 + Q_3 + Q_4 + Q_5 + Q_6 + Q_7 + Q_8 + Q_9 + Q_{10} + Q_{11}$

ELECTRODE (TERMINAL 1) - EXAMPLE: POROUS CARBON OR DOPED SILICON. CAN BE CONDUCTIVE CARBON OR SILICON NANOTUBE
ELECTROLYTE (TERMINAL X) - EXAMPLE: POTASSIUM HYDROXIDE
ELECTRODE (TERMINAL 2) - EXAMPLE: POROUS CARBON OR DOPED SILICON. CAN BE CONDUCTIVE CARBON OR SILICON NANOTUBE

# INTEGRATED ULTRACAPACITOR AS ENERGY SOURCE

FIELD

This invention relates to energy storage devices, and more particularly to capacitive structures formed in integrated circuits and methods for making the same.

BACKGROUND OF THE INVENTION

A battery is a device that stores electric charge for use as a power source. The charging process is based on a chemical reaction that takes place between an electrolyte and two electrodes called an anode and cathode. The capacity to store electric charge is a function of the surface area of these electrodes and the particular electrolyte used.

Common types of batteries include sealed lead acid (SLA) batteries, nickel-cadmium (Ni—Cd) batteries, and lithium-ion (Li-Ion) batteries. SLA batteries can hold a charge for up to three years and are generally used to provide backup power during emergencies. Ni—Cd batteries provide a fast, even energy discharge and are most often used to power appliances and audio and video equipment. Li-Ion batteries have the highest energy storage capacity (generally twice the capacity of Ni—Cd batteries) and are used to power portable computers, cellular phones, and digital cameras to name a few.

Another type of battery known as a double-layer capacitor stores energy based on a microscopic charge separation that takes place at an electrical-chemical interface between an electrode and electrolyte. The capacitor is charged by a primary energy source and then discharged when connected to a device to be powered, generally referred to as a load. The charging and discharging process is repeatable; that is, after discharging takes place through the load the capacitor may be recharged by connecting its electrodes to the primary energy source. Double-layer capacitors have been used to power bulk electronic devices including radios, motors, and the like.

On a vastly smaller scale and more particularly in the field of large scale integration, solid-state capacitors are used to store charge. Unlike double-layer capacitors and other types of electrochemical batteries, solid-state capacitors store energy in the form of an electrostatic field between a pair of conductive layers separated by a dielectric material. In these devices, capacitance is directly proportional to the surface areas of the conductive layers and is inversely proportional to the separation distance between these layers. Capacitance also depends on the dielectric constant of the material separating the layers.

Because solid-state capacitors are only formed from two conductive layers, they are limited in terms of the amount of voltage they can store. Attempts have been made to increase the storage capacity of solid-state capacitors by increasing the surface area of the conductive layers. This approach, however, has proven to be undesirable because the increased surface area consumes an excessive amount of die space. A need therefore exists for an improved energy storage device for use in integrated circuits.

DESCRIPTION OF THE PREFERRED EMBODIMENTS

Figure 1:
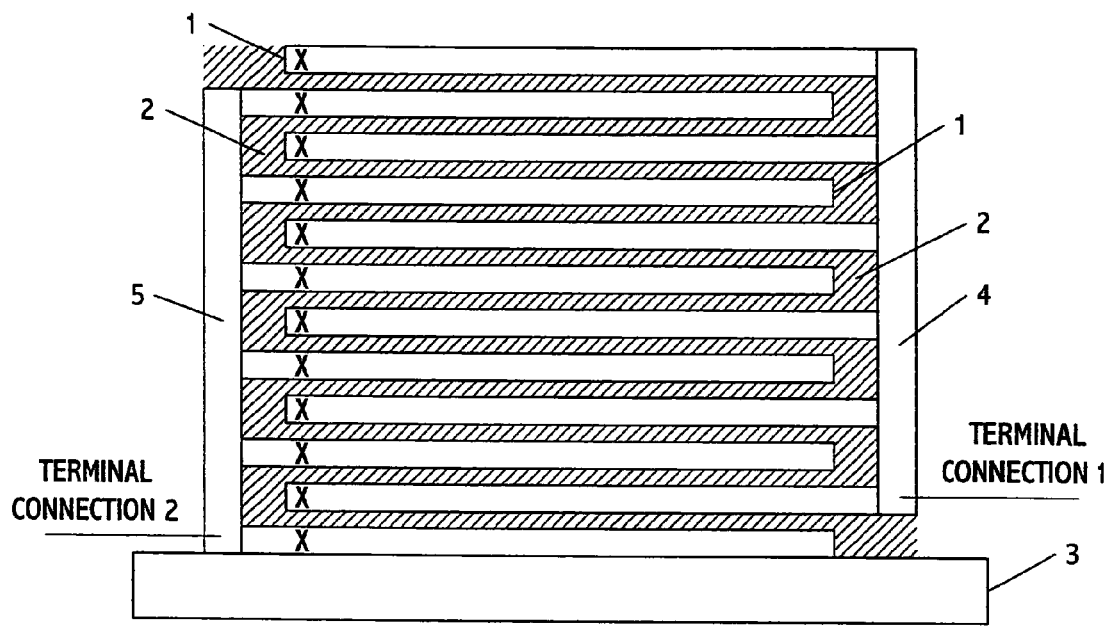
FIG. 1 is a diagram showing a cross-sectional view of an ultracapacitor according to one embodiment of the present invention.

FIG. 1 shows an ultracapacitor according to one embodiment of the present invention. The ultracapacitor includes a plurality of conductive layers 1 with intervening dielectric layers 2 formed on a semiconductor substrate 3. The substrate may be formed from or include p-type or n-type material or may be formed as a silicon-on-insulator (SOI) substrate. Preferably, the substrate is formed from a silicon die which supports the ultracapacitor in an integrated circuit chip package either alone, with other ultracapacitors, or with other circuits including, for example, those that are to be powered by or otherwise operate based on a voltage stored in the ultracapacitor. While silicon is preferable, the substrate may be used by other semiconductor materials including but not limited to gallium arsenide and germanium.

The dielectric layers are respectively formed between the conductive layers and are preferably made from a material having a high dielectric constant k. Non-limiting examples include a hafnium oxide such as hafnium dioxide ($HfO_2$) having a k=15, zirconium dioxide ($ZrO_2$) having a k=22, and Barium titanate powder ($BaTiO_3$) having a k=230. Materials with other k values may be used depending, for example, on the capacitance requirements of a specific application. The thicknesses of the dielectric layers are controlled during fabrication to achieve a predetermined voltage-storage capacity at respective portions of the ultracapacitor.

The conductive layers may be made of any conductive material including but not limited to metal or polysilicon. The number of conductive layers may be varied to satisfy the requirements of a particular application. For illustrative purposes twelve layers are shown in FIG. 1, however the ultracapacitor may be formed from a larger or smaller number of layers with three layers being a minimum. When situated in this manner, at least one of the layers will have upper and lower surfaces which are used to store charge with adjacent layers. In the embodiment shown, the odd-numbered conductive layers are interconnected by a stud line 4, which is connected to a first terminal of the ultracapacitor. The even-numbered conductive layers are interconnected by a stud line 5, which is connected to a second terminal of the ultracapacitor.

For all practical purposes, each metal layer in the ultracapacitor will have a minimum and maximum allowable width. In some applications, it may be preferable to use the minimum width in order to allow a larger number of layers to be interleaved and thus to increase the cross-capacitance per layer. In other applications, larger widths may be used, i.e, depending on the process technology and metals used the widths of all or a portion of layers 1 may be larger than a minimum allowable width in order to achieve, for example, a specific cross-capacitance, parasitic resistance, or other level of performance.

In FIG. 1, the widths of the conductive layers are shown to be equal and the same is true of the spacings between the layers. In alternative embodiments, the widths and/or spacings may vary. For example, in FIG. 8(a), an ultracapacitor having conductive layers of differing widths but equal spacings is shown. This difference in width affects parasitic resistance that appears in series with capacitance. While the widths of the conductive layers in FIG. 8(a) uniformly decrease from top to bottom, other variations include uniformly increasing conductive-layer widths or ones which do not uniformly vary at all to achieve a predetermined charge-storage distribution throughout the ultracapacitor structure. The spacings between the layers may also be uniformly or non-uniformly varied to achieve a specific level of performance. In general, the smaller the spacing the larger the capacitance and hence the greater the charge storage capacity of the ultracapacitor.

In the foregoing illustrative embodiment, the ultracapacitor is shown as having twelve interleaved metal layers. Six layers are connected to a first terminal (terminal connection 1) and the other six are connected to a second (terminal connection 2). The six layers connected to the first terminal will therefore assume the voltage applied to the first terminal, and the six layers connected to the second terminal will assume the voltage applied to the second terminal. The ultracapacitor therefore may be regarded as a parallel connection of a plurality of capacitors.

Structured in this manner, the ultracapacitor collectively stores a charge equal to the potential difference between the first and second terminals. For example, if $V_1$ is applied to the first terminal and $V_2$ is applied to the second terminal, the ultracapacitor will store a voltage equal to $V_2-V_1$ between the terminals. The capacitance for storing charge corresponding to this voltage difference depends on the number of metal layers connected between the terminals, i.e., the more metal layers (and thus capacitors) between the terminals the greater the capacitance available for storing $V_2-V_1$.

Figure 2:
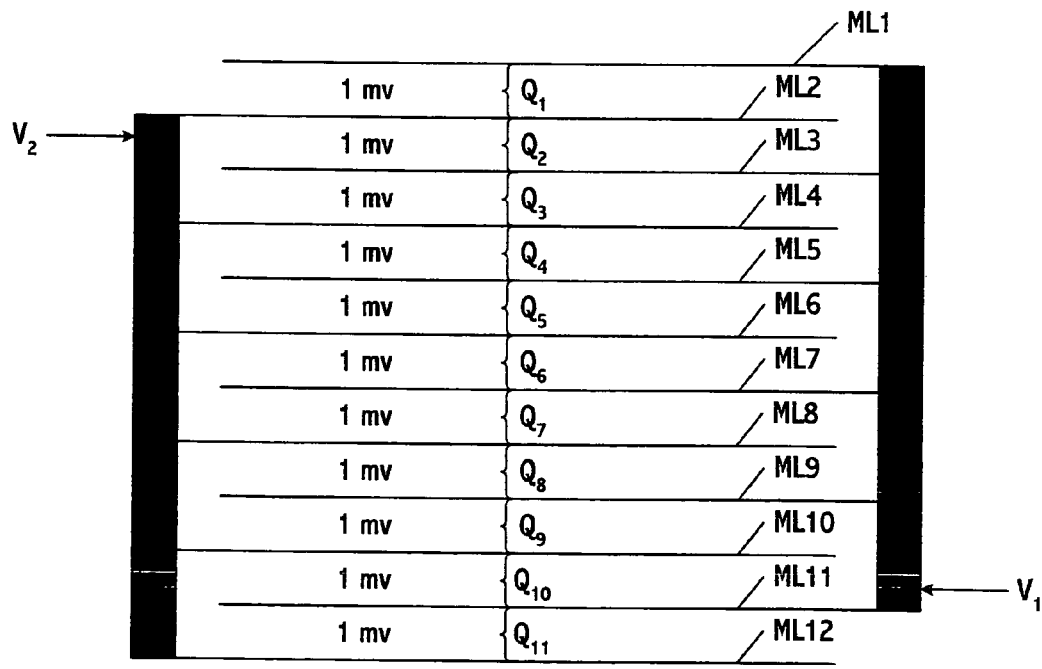
FIG. 2 is a diagram showing an example of a charge-distribution that may be supported by the ultracapacitor of FIG. 1.

FIG. 2 shows the charge storage distribution for the ultracapacitor of FIG. 1. In this figure, both upper and lower surfaces of intermediate metal layers ML2–ML11 store charge for separate capacitors, e.g., ML1 and the upper surface of ML2 form a first capacitor, the lower surface of ML2 and the upper surface of ML3 form a second capacitor, and so on. A total of eleven capacitors is therefore formed from the twelve metal layers.

The amount of charge stored between each overlapping pair of metal layers depends on factors including the spacing between the layers, widths of the layers, and the k value of the intervening dielectric. Metal layers having larger widths are expected to store more charge than layers with smaller widths, and vice versa. These widths or any of the aforementioned factors may be set to achieve a specific charge distribution for a given application. For example, if the widths or spacings between the layers are not the same, each adjacent pair of metal layers may store a different proportion of charge. Thus, both uniform and non-uniform charge distributions are possible. For illustrative purposes, the total charge $Q_{total}$ stored in the capacitor is shown as a sum of the charges $Q_1$ through $Q_{11}$.

Figure 3:
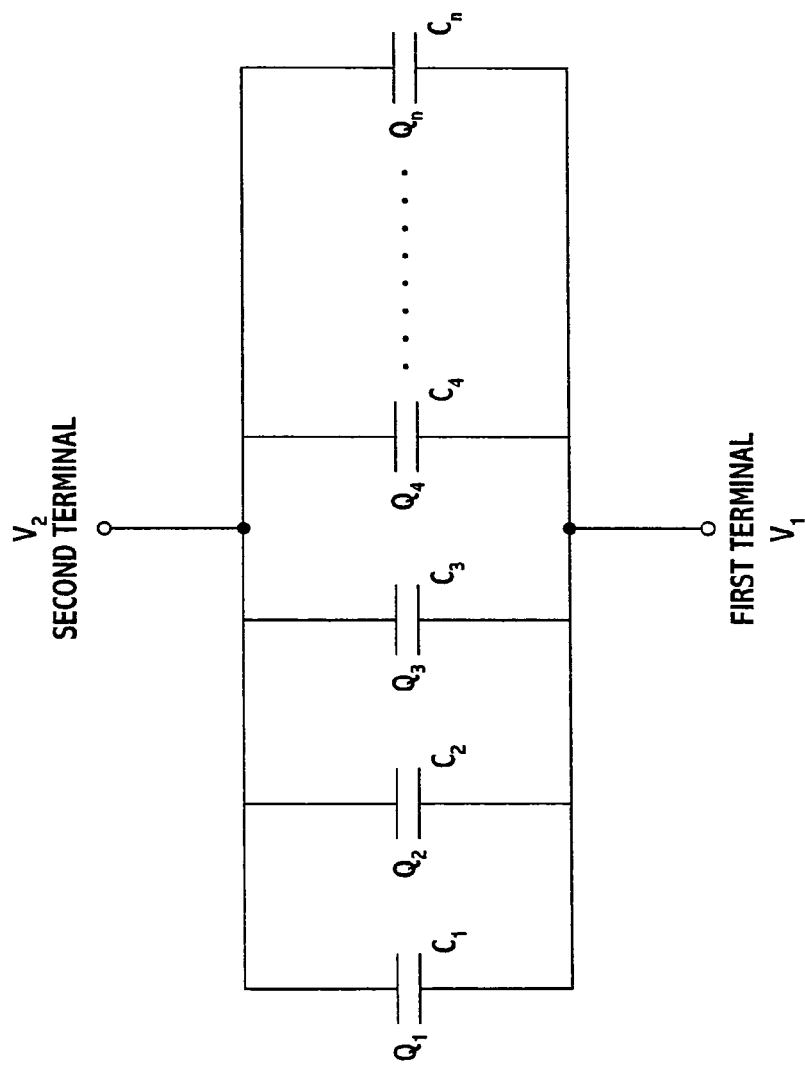
FIG. 3 is an equivalent circuit diagram of the ultracapacitor of FIG. 1.

FIG. 3 shows an equivalent circuit diagram for the ultracapacitor of FIG. 1. As previously indicated, this circuit includes capacitors $C_1$–$C_{11}$ formed from overlapping pairs of adjacent metal layers 1 connected between two terminals. The voltages applied to the terminals are respectively shown as $V_1$ and $V_2$. In this parallel arrangement, the voltage across each capacitor is the same ($\Delta V=V_2-V_1$) and the charges stored in each of capacitors $C_1$–$C_{11}$ are represented as $Q_1$–$Q_{11}$ respectively. Since Q=CV, the total capacitance of the ultracapacitor may be represented as a sum of the capacitances:

$$C_{total} = (Q_1 + Q_2 + Q_3 + \ldots + Q_{11})/\Delta V$$
$$= Q_1/\Delta V + Q_2/\Delta V + Q_3/\Delta V + \ldots + Q_{11}/\Delta V$$
$$= C_1 + C_2 + C_3 + \ldots + C_{11}$$

From the above equations, it is evident that the overlapping pairs of adjacent metal layers included in the embodiments described herein have the effect of increasing the overall capacitance and thus the charge-storage capacity of the ultracapacitor for a given voltage. When implemented in silicon or another semiconductor material, the embodiments described herein may be used for a variety of integrated circuit applications, e.g., driving an on-chip load, powering a circuit, storing data, etc.

Figure 4:
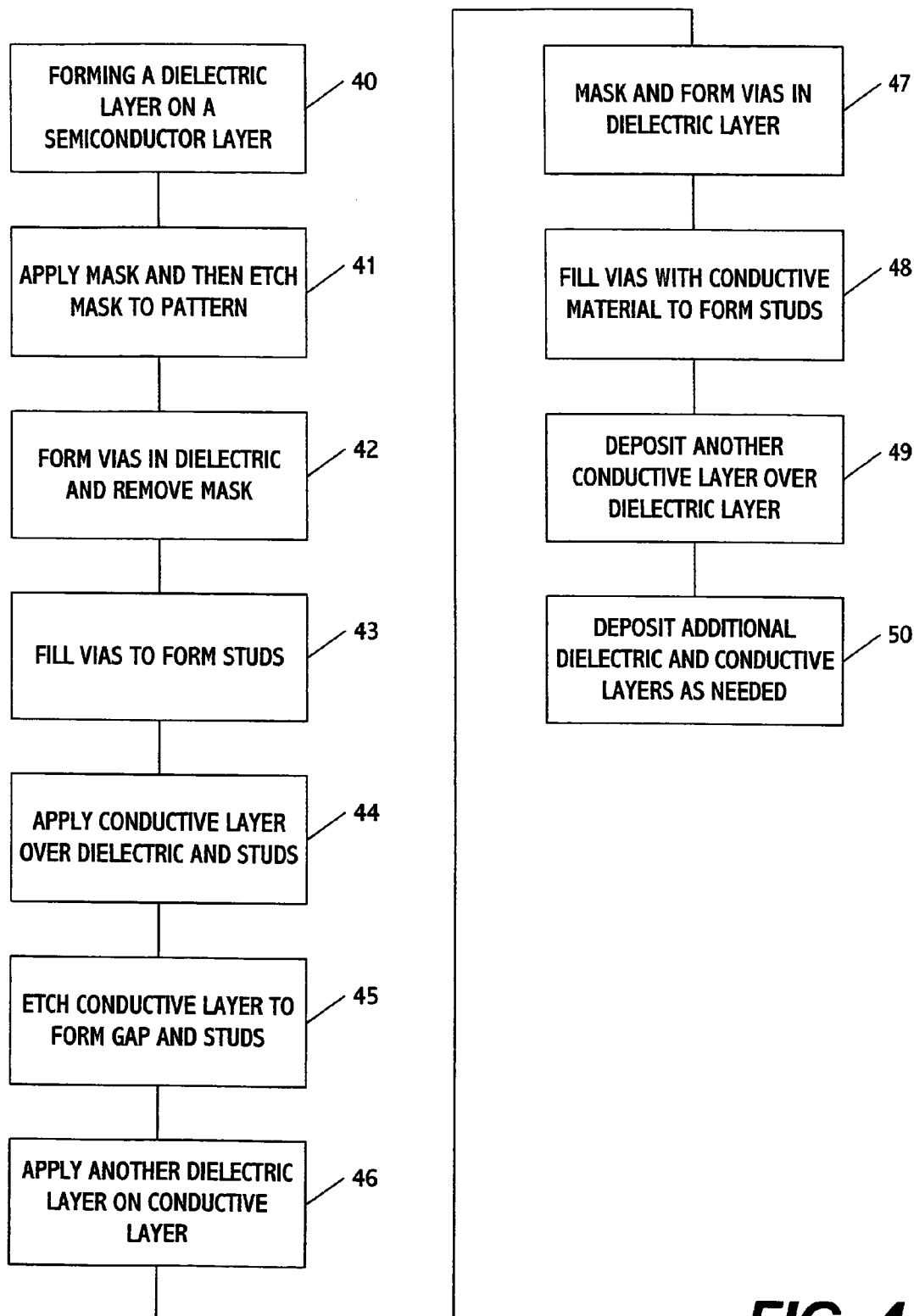
FIG. 4 is a diagram showing blocks included in a method for forming an ultracapactor in accordance with one embodiment of the present invention.

FIG. 4 shows a method for forming an ultracapacitor in accordance with an embodiment of the present invention. This method uses known semiconductor-chip fabrication techniques to achieve any of the aforementioned ultracapacitor structures. By way of illustration, FIGS. 5(a)–5(k) show the results of individual stages of the method when applied to form an ultracapacitor having conductive layers whose widths uniformly vary but which have substantially constant spacings.

An initial stage involves forming a dielectric layer 11 on the surface of a semiconductor layer 10 to a predetermined thickness. (Block 40, FIG. 5(a)). The dielectric layer may be any of those previously mentioned or any another type. Preferably, the dielectric material has a high k value, however this is not a necessity. Layer 10 is fromed silicon or another type of semiconductor material which, for example, may be included as part of a die of an integrated circuit chip.

Once formed, the dielectric layer is coated with a masking layer 12 using any one of a variety of deposition techniques, e.g., chemical vapor deposition. Portions of the masking layer are then etched away using, for example, lithography and reactive ion etching to form holes 13 and 14 at locations where vias are to be formed in the ultracapacitor structure. (Block 41, FIG. 5(b)). A subsequent etching may then be performed to form the vias 15 and 16 in the dielectric layer and to remove remaining portions of the masking layer. (Block 42, FIG. 5(c)).

The vias are then filled with a conductive material to form studs 17 and 18 in the dielectric layer. This may be accomplished using known deposition techniques. The studs form portions of different terminals which are eventually connected to the conductive layers. (Block 43, FIG. 5(d)).

Figure 5A:
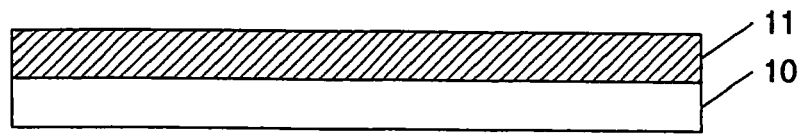
FIGS. 5(a)–5(k) are diagram showing results obtained when respective blocks of the process shown in FIG. 4 are performed.
Figure 5B:
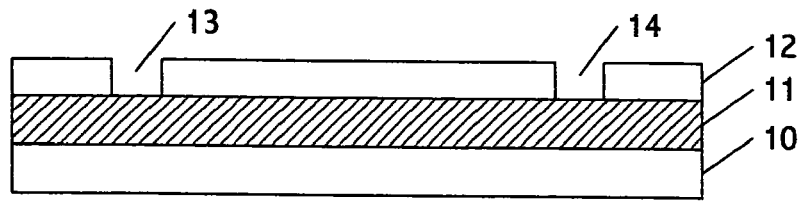
Figure 5C:
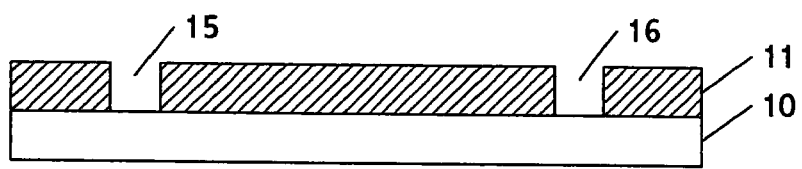
Figure 5D:
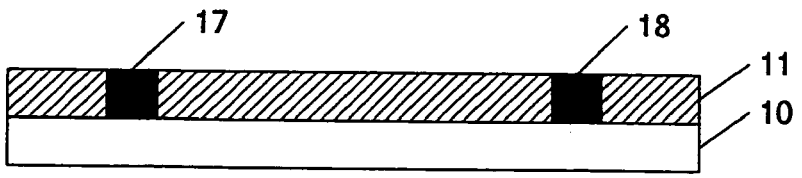
Figure 5E:
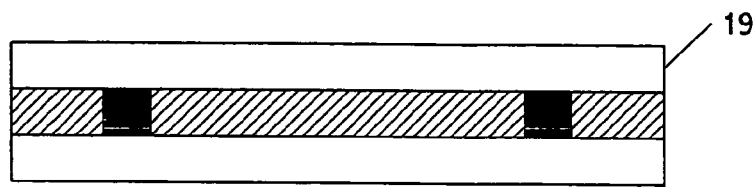
Figure 5F:
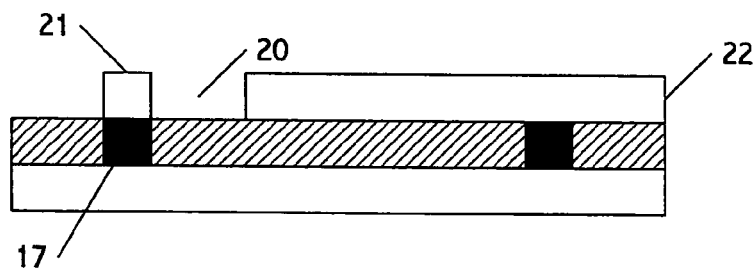
Figure 5G:
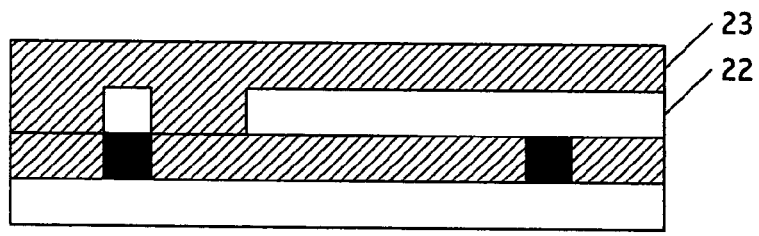
Figure 5H:
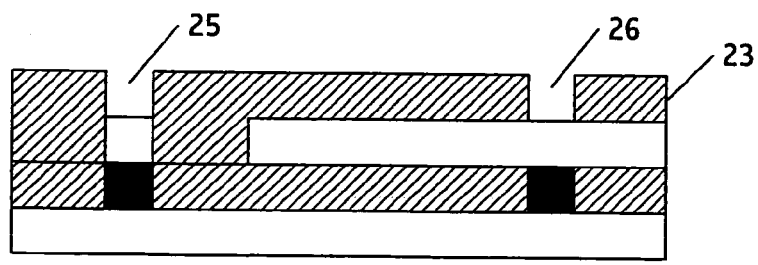
Figure 5I:
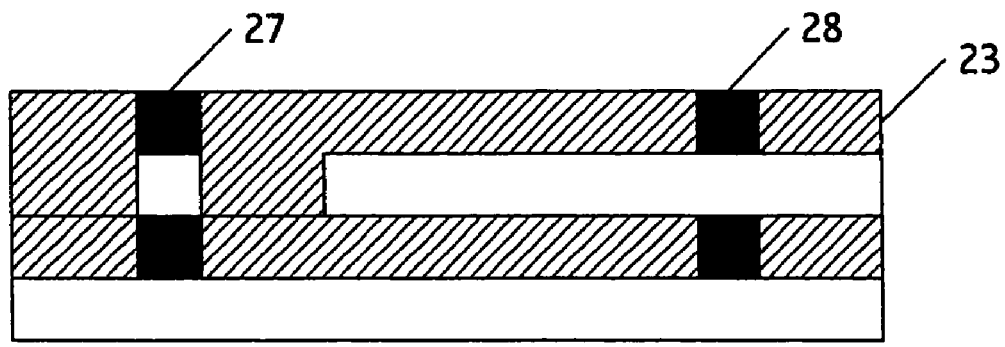
Figure 5J:
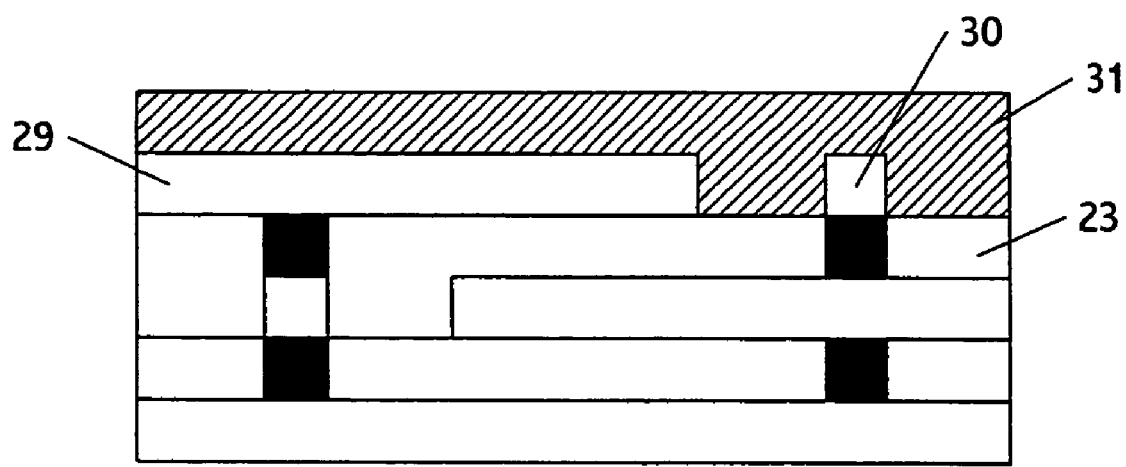
Figure 5K:
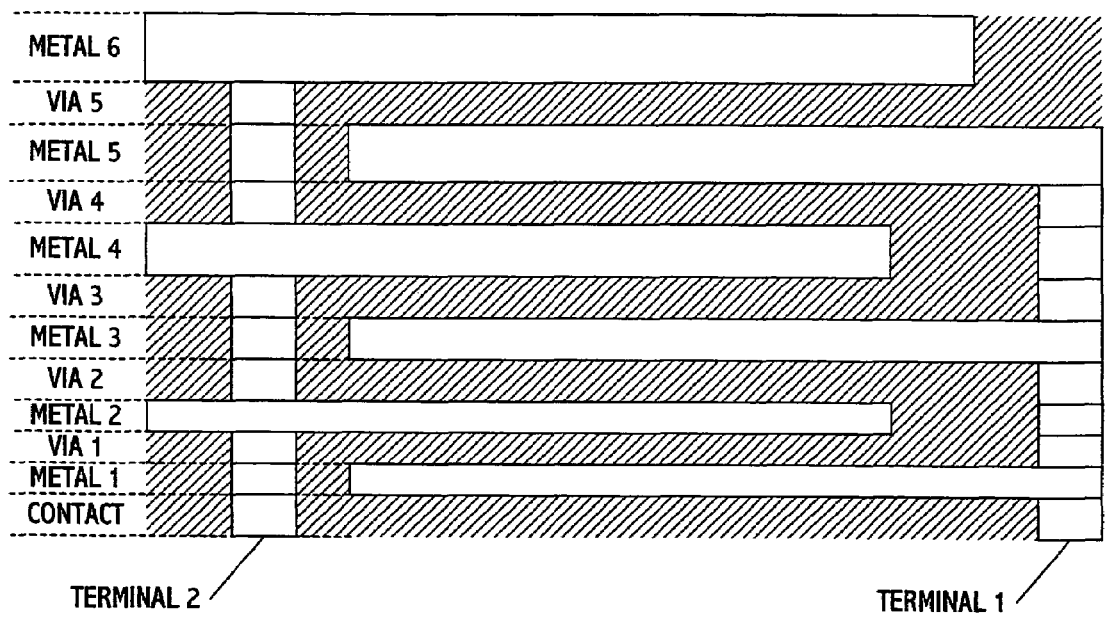

Next, a conductive layer 19 is deposited on the dielectric layer and studs to a predetermined thickness. (Block 44, FIG. 5(e)). The conductive layer may be made from a polysilicon or metal. A masking layer (not shown) is then applied and portions of the metal layer are etched away leaving a gap 20 as shown in FIG. 5(f). The portion of the conductive layer on the left side of the gap forms a second stud 21 on top of stud 17, and portion of the conductive layer on the right side serves as a first conductive layer 22 of the ultracapacitor. (Block 45).

Another dielectric layer 23 is then deposited on the conductive layer to a predetermined thickness, thereby filling the gap. (Block 46, FIG. 5(g). The thickness of this dielectric layer may be the same as layer 11 or may be different depending on the level of performance and/or charge distribution requirements of the ultracapacitor.

A masking layer is then formed over layer 23 and portions of the masking layer are etched away exposing areas where vias 25 and 26 are etched into layer 23 by reactive ion etching or another technique. (Block 47, FIG. 5(h)). Via 25 is etched at a position which coincides with stud 21 and via 26 is etched to expose a portion of conductive layer 22. A conductive material is then deposited into the vias to form studs 27 and 28, which are in respective contact with underlying stud 21 and conductive layer 22. (Block 48, FIG. 5(i)).

A conductive material is then deposited on top of dielectric layer 23 followed by lithography and etching to form the second conductive layer 29 and an aligned stude 30 of the ultracapacitor. In the figure, conductive layer 29 is shown to be of the same width as layer 22, however these widths may be different depending on the level of performance and/or charge storage distribution requirements of the ultracapacitor. A mask is applied and a portion of layer 29 is etched away, leaving a gap 24 which is filled with dielectric material during formation of a third dielectric layer 31. (Block 49, FIG. 5(j)).

Additional dieletric and conductive layers are alternately formed at predetermined thicknesses and spacings until all the layers an intervening studs of the ultracapacitor are formed. (Block 50, FIG. 3(k)). Terminals may then be formed and electrically connected to stud line or the terminals may be formed before formation of the first dielectric layer. At the conclusion of this process, preferably half the conductive layers are connected to one stud line and the remaining half to another stud line.

Figure 6A:
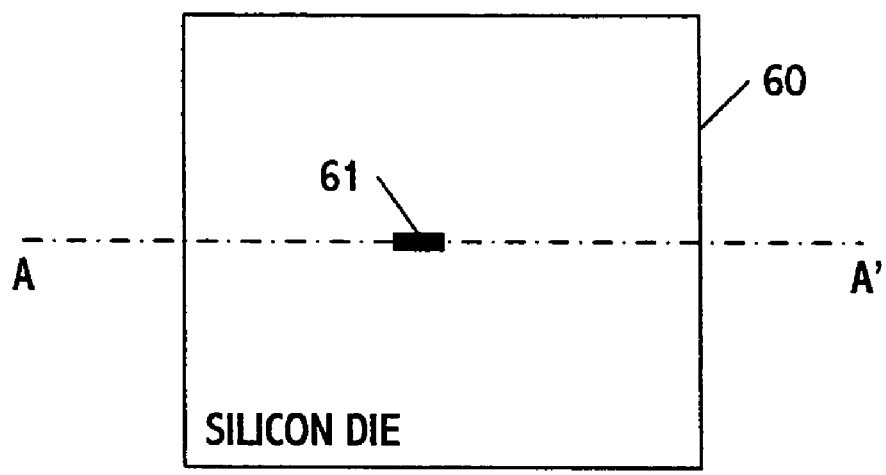
FIG. 6 is a diagram showing a semiconductor die having an ultracapacitor formed thereon in accordance with one embodiment of the present invention.
FIG. 6(b) shows an equivalent circuit diagram for this ultracapacitor.
FIG. 6(c) shows a cross-sectional view of the ultracapacitor.
Figure 6B:
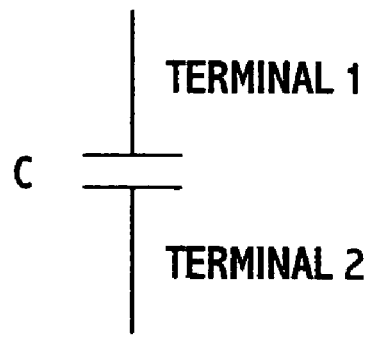
Figure 6C:
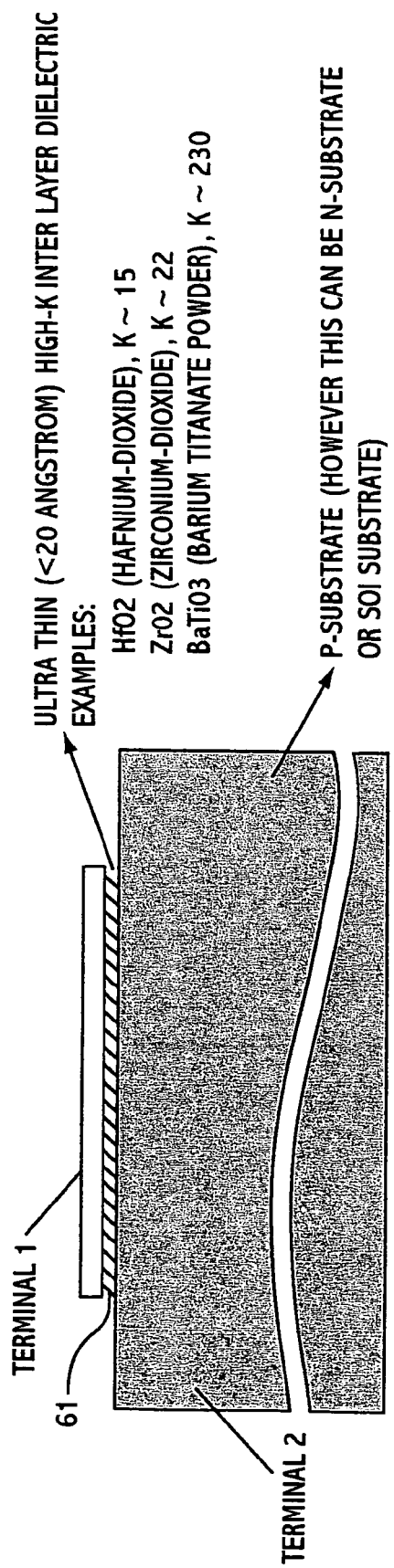

FIG. 6(a) shows a semiconductor die 60 having an ultracapacitor 61 formed thereon in accordance with one embodiment of the present invention, and FIG. 6(b) shows an equivalent circuit diagram for this ultracapacitor where $C_{uc}$ represents capacitance and terminals 1 and 2 are connected to respective stud lines of the capacitor. The die may be made of silicon or another semiconductor material. FIG. 6(c) shows a cross-sectional view of ultracapacitor 61 taken along section line A–A'. Terminal 1 is formed on top of the ultracapacitor and terminal 2 is shown as residing on a p-type substrate. In this embodiment, the ultracapacitor may have an ultra-thin width (e.g., 20 Angstroms or less) using a high-k inter-layer dielectric. The second terminal may alternatively be formed on an n-type substrate or on a silicon-on-insulator structure.

Figure 7A:
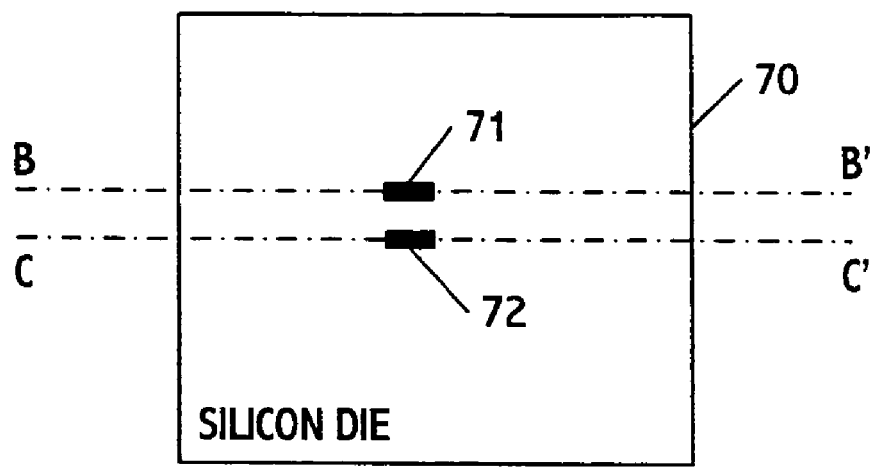
FIG. 7(a) is a diagram showing a silicon die having two ultracapacitors which are formed to be identical or different in accordance with any one or more embodiments described herein.
Figure 7B:
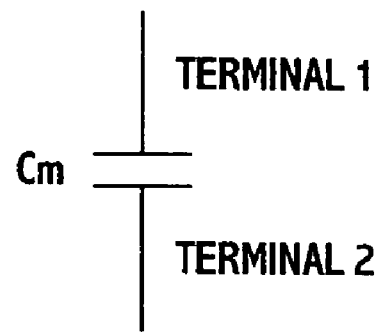
FIG. 7(b) shows an equivalent circuit diagram of at least one of the ultracapacitors.

FIG. 7(a) shows a silicon die 70 having two ultracapacitors 71 and 72 that may be formed according to the one or more of the forgoing embodiments of the present invention, and FIG. 7(b) shows an equivalent circuit diagram which may represent at least one of the ultracapacitors. The ultracapacitors may be structurally identical or different in respect to their storage capacities and/or charge distributions, e.g., ultracapacitor 71 may have a different number of conductive layers than ultracapacitor 72, different spacings between the conductive layers, different widths for their conductive layers, or a combination of the foregoing. For illustrative purposes, the capacitor in FIG. 7(b) is shown to have a capacitance $C_m$.

Figure 8A:
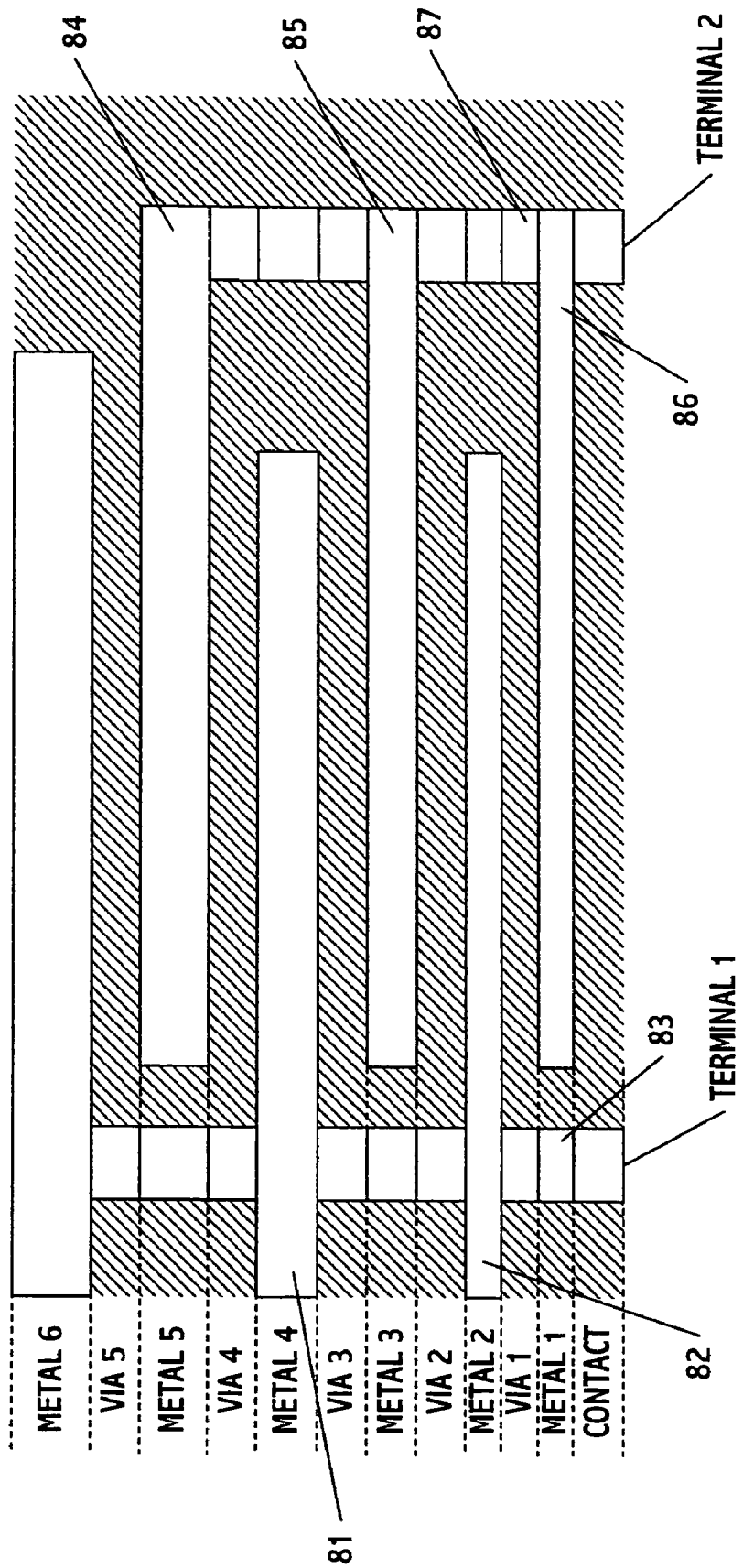
FIG. 8(a) is a diagram showing in cross-section the first ultracapacitor in FIG. 7(a)

FIG. 8(a) shows cross-sectional view of ultracapacitor 71 taken along section line B–B'. In this example ultracapacitor 71 has three conductive layers 80–82 connected to terminal 1 through stud line 83 and three conductive layers 84–86 connected to terminal 2 through stud line 87. The conductive layers are formed to have uniformly changing widths from top to bottom. Specifically, layers 80 and 84 have substantially equal widths that are the largest in the capacitive structure. Layers 81 and 85 have substantially equal widths and are of intermediate size. And, layers 82 and 86 have substantially equal widths and are the smallest in the capacitive structure. The widths of all the dielectric layers are shown to be equal.

Figure 8B:
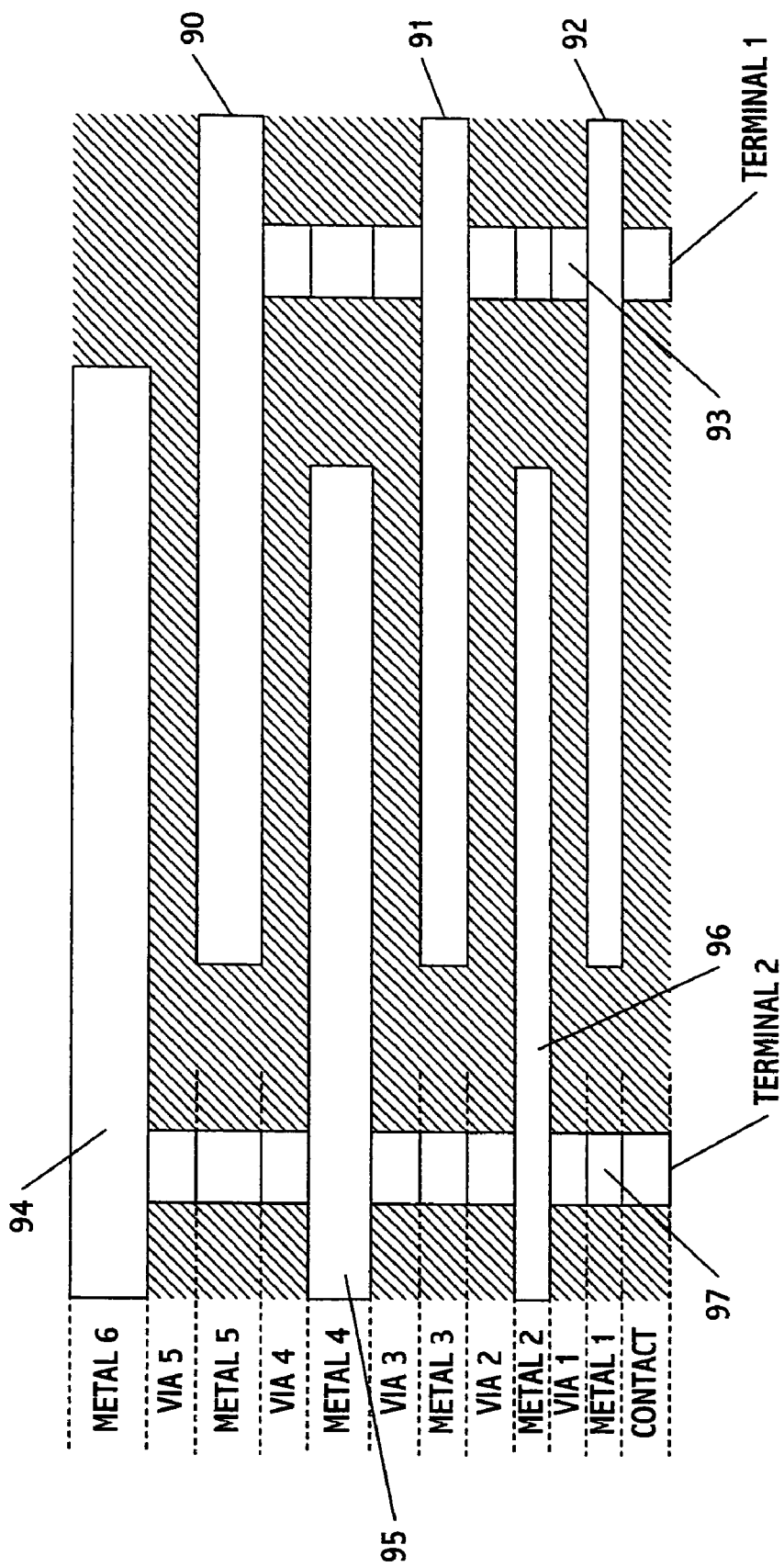
FIG. 8(b) shows the second ultracapacitor in this figure.

FIG. 8(b) shows a cross-sectional view of ultracapacitor 72 taken along section line C–C'. In this example ultracapacitor 72 has the same number of conductive layers as ultracapacitor 71. Three conductive layers 90–92 are connected to terminal 1 through stud line 93 and three conductive layers 94–96 connected to terminal 2 through stud line line 97. The conductive layers are formed to have a uniformly changing widths from top to bottom. Specifically, layers 90 and 94 have substantially equal widths and are the largest in the capacitive structure. Layers 91 and 95 have substantially equal widths and are of intermediate size. And, layers 92 and 96 have substantially equal widths and are the smallest in the capacitive structure. The widths of all the dielectric layers are shown to be equal. A comparison of FIGS. 8(a) and 8(b) shows that the ultracapacitors have opposing terminal configurations.

Figure 9A:
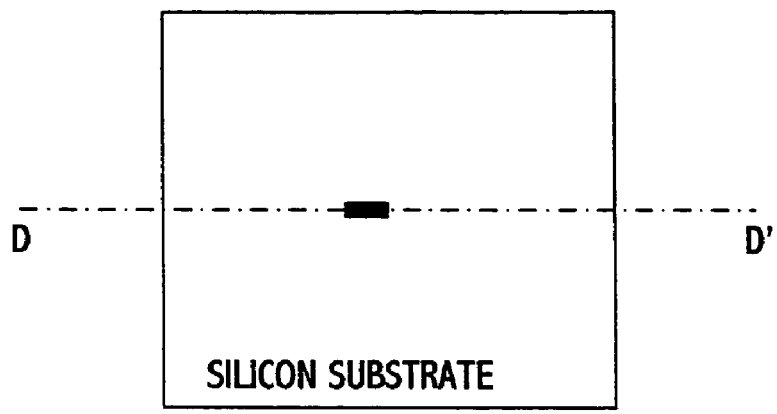
FIG. 9(a) is a diagram showing a semiconductor die including an ultracapacitor in accordance with another embodiment of the present invention.
Figure 9B:
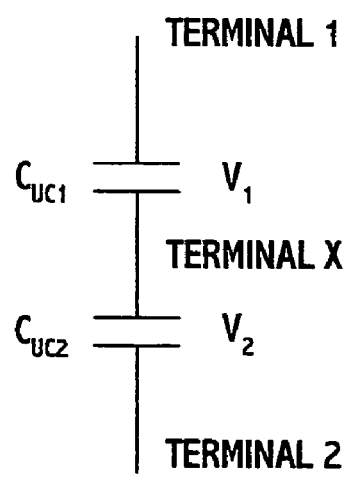
FIG. 9(b) shows an equivalent circuit diagram for this ultracapacitor.

FIG. 9(a) shows a semiconductor die 80 in accordance with another embodiment of the present invention, and FIG. 9(b) shows an equivalent circuit diagram an ultracapacitor arrangement formed thereon. This arrangement includes two ultracapacitor connected in series and having capacitances $C_{uc1}$ and $C_{uc2}$ respectively. The ultracapacitors $C_{uc1}$ and $C_{uc2}$ may be the same or different depending on the application. The input terminal is shown as terminal 1, the output terminal is shown as terminal 2, and an intermediate terminal connecting the ultracapacitors is shown as terminal x.

Because of the series connection, the total voltage $V_{total}$ of the ultracapacitor arrangement equals a sum of the voltages stored in each ultracapacitor, $V_{total}=V_1+V_2$, and the total charge is equal to the charge on the total capacitance. Given Q=CV, the total capacitance of the ultracapacitor arrangement may therefore be expressed as: $1/C_{total}=1/C_{uc1}+1/C_{uc2}$.

Figure 10:
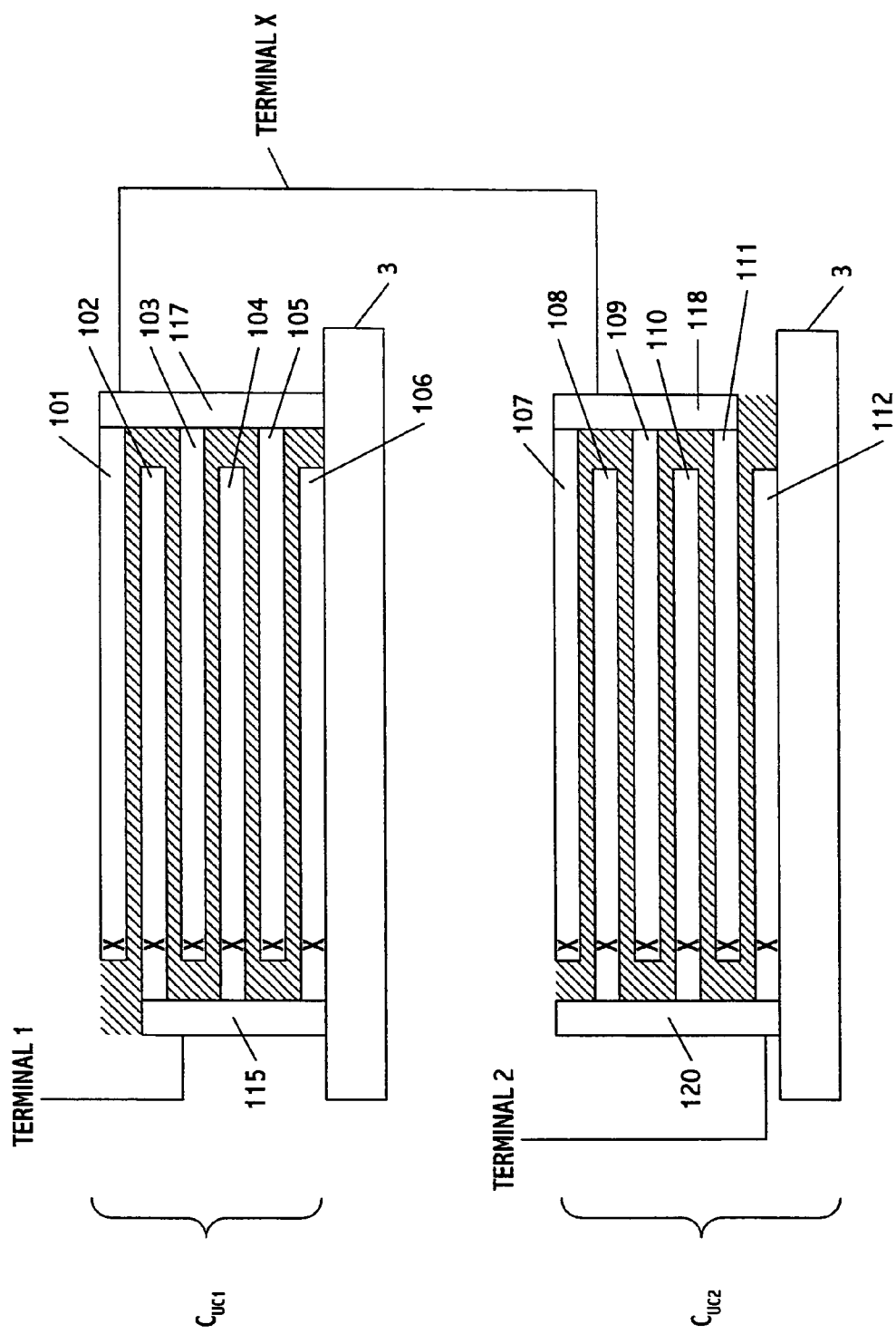
FIG. 10 is a diagram showing an example in cross-section of how the ultracapacitor in FIG. 9(a) may be formed.

FIG. 10 shows an example of how terminal x may be connected to ultracapacitor sections in the foregoing embodiment, taken along section line D–D'. In this example, conductive layers 101–106 form first ultracapacitor $C_{uc1}$ formed on substrate 3 and conductive layers 107–112 form second ultracapacitor $C_{uc2}$. Input terminal 1 is connected to stud 115, output terminal 2 is connected to stud line 120 at a location which coincides with layer 112, and intermediate terminal x connects stud line 117 in the first ultracapacitor to stud line 118 of the second ultracapacitor. Terminal x therefore establishes the series connection between the ultracapacitors.

Figure 11:
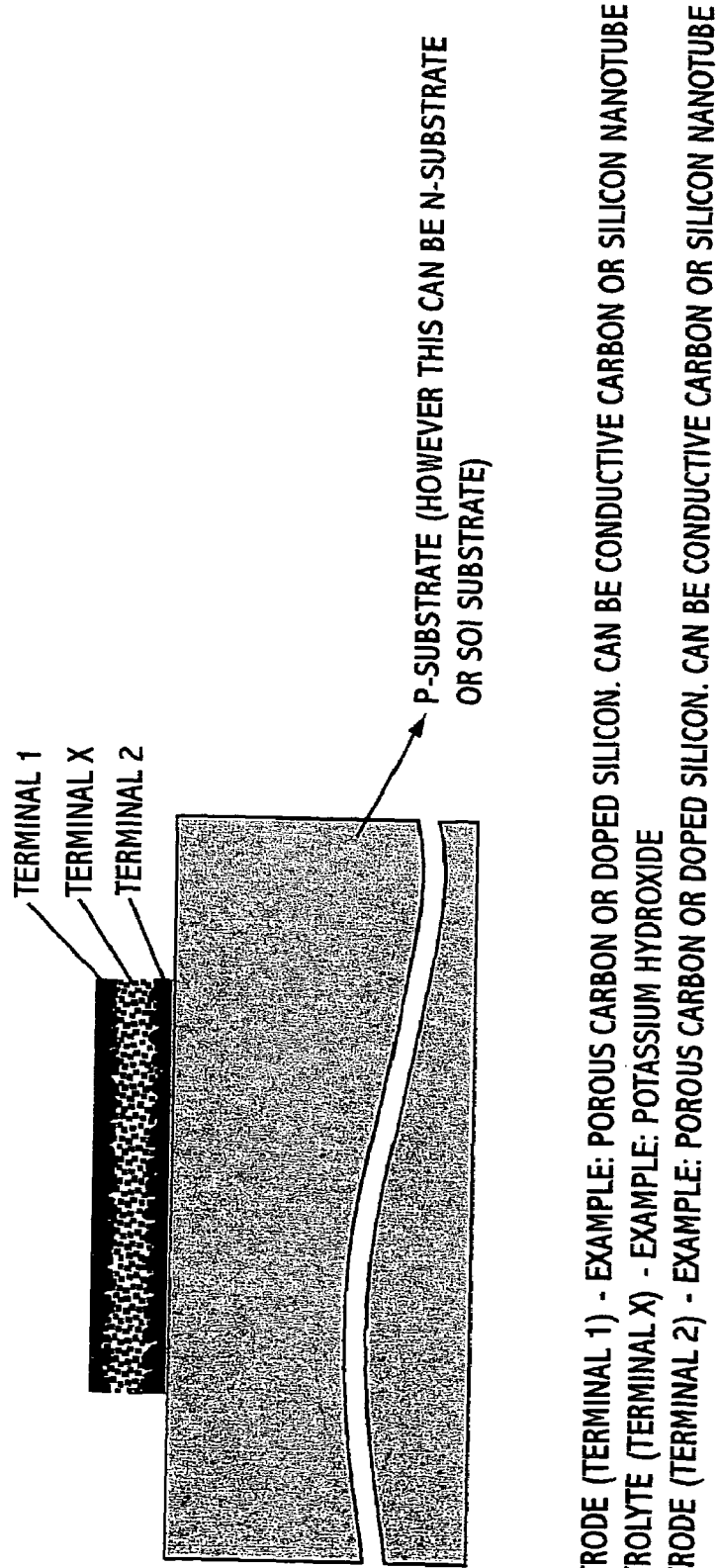
FIG. 11 is a diagram showing a side view of the ultracapacitor of FIG. 10.

FIG. 11 shows an example of how the aforementioned embodiment may be implemented. In this example, terminals 1 and 2 may be made of a porous carbon material or doped silicon and more specifically may be a conductive carbon or silicon nanotube. Intermediate terminal x may be made of potassium hydroxide. The underlying substrate may be made from a p-type or n-type material or may have a silicon-on-insulator structure. In this figure, the dots represent a conducting material that forms a capacitive connection between terminals 1 and 2. The jagged edges increase the surface area of the capacitance between terminals 1 and 2 and terminal x. Terminal x is preferably made from a different material in order to establishing a capacitive connection between terminals 1 and 2 instead of a resistive connection and to prevent the possibility of an electrical short. Also, terminal x is not tapped out externally in this embodiment.

Figure 12:
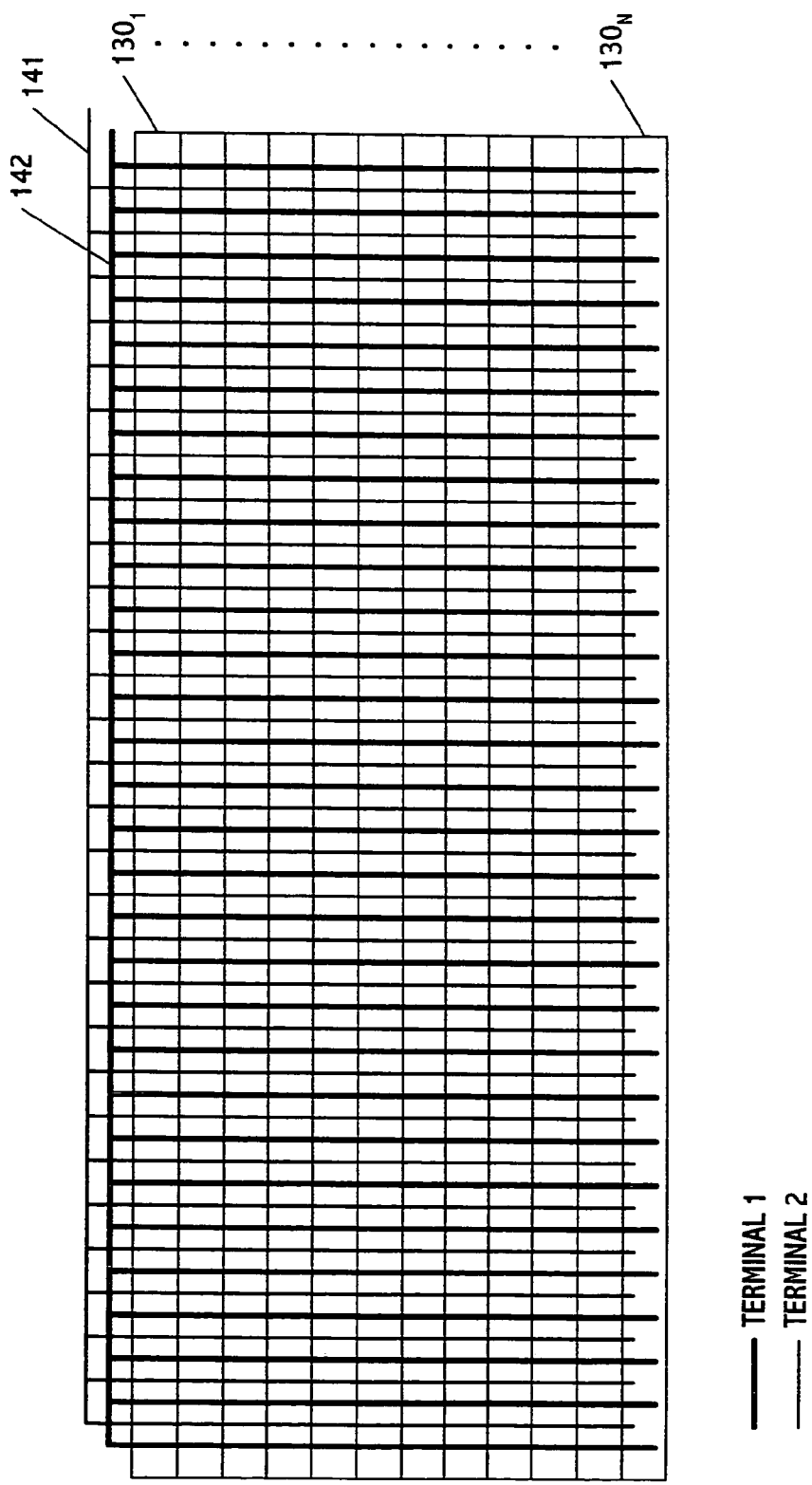
FIG. 12 shows in cross-section a stacked ultracapacitor in accordance with one embodiment of the present invention.

FIG. 12 shows in cross-section stacked substrates each of which includes an ultracapacitor in accordance one or more of the embodiments of the present invention. Stacking the ultracapacitors is advantageous because it increases the capacitance per unit area. In this embodiment, a plurality of substrates $130_1$ to $130_N$ are stacked one on top of the other. Common input and output terminals 141 and 142 are then used to connect the capacitors. By stacking the capacitors in this manner, a very large charge can be stored for serving a variety of purposes including but not limited to the formation of rechargeable batteries, e.g., where terminal 1 is set to 5V or another voltage and terminal 2 to 0V. Any of the embodiments of the ultracapacitor described herein may be implemented to perform this rechargeable battery application.

One advantage of using the ultracapacitor embodiments for this application is reduced charging times, e.g., charging time will be very small and the ultracapacitor may be recharged to full capacity a larger number of times compared with other rechargeable battery structures which have been proposed. One non-limiting application of using the ultracapacitor embodiments of the present invention is as a rechargeable power source for a portable computing device such as laptop and notebook computers, personal digital assistants, and telecommunication devices including but not limited to mobile phones which may or may not be web-enabled. In these embodiments, it may be preferable to store a charge in the range of 1V –5V in the ultracapacitor, however greater or lesser voltages outside this range may also be stored.

Figure 13:
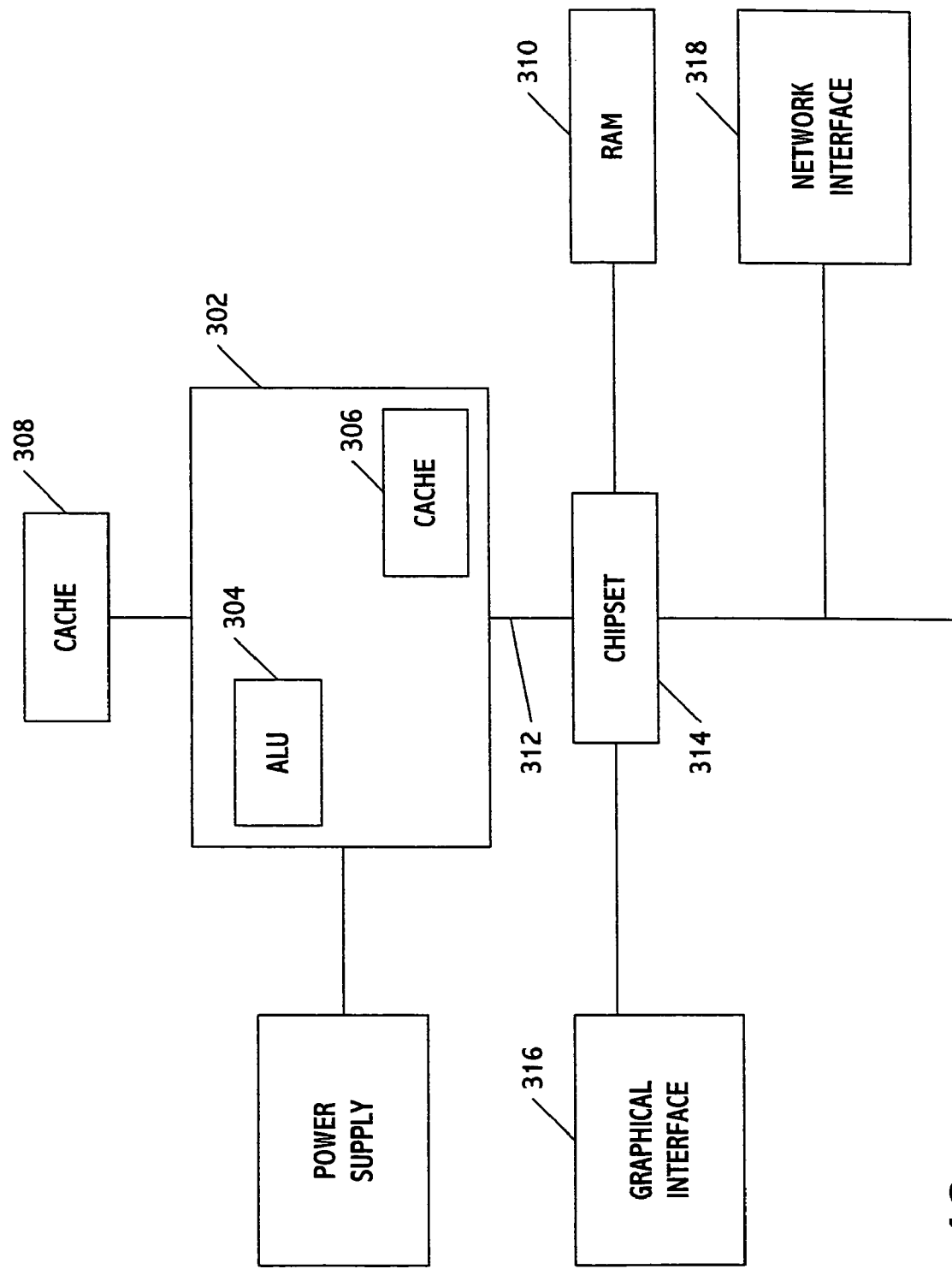
FIG. 13 is a diagram showing a processing system which may include one or more embodiments of the ultracapacitor of the present invention.

FIG. 13 is a diagram showing a processing system which includes a processor 302, a power supply 304, and a memory 306 which, for example, may be a random-access memory. The processor includes an arithmetic logic unit 302 and an internal cache 303. The system also preferably includes a graphical interface 308, a chipset 310, a cache 312, and a network interface 314. The processor may be a microprocessor or any other type of processor. If the processor is a microprocessor, it may be included on a chip die with all or any combination of the remaining features, or one or more of the remaining features may be electrically coupled to the microprocessor die through known connections and interfaces. The power supply may correspond to any one of the embodiments of the present invention described herein. An ultracapacitor included in these embodiments may also be included on the same chip with or may be integrated into any feature in FIG. 13, including ones formed by or supported in silicon or which is isolated by an insulating material, e.g., silicon dioxide.

Other modifications and variations to the embodiments of the invention will be apparent to those skilled in the art from the foregoing disclosure. Thus, while only certain embodiments have been specifically described herein, it will be apparent that numerous modifications may be made thereto without departing from the spirit and scope of the invention.

We claim:

1. An ultracapacitor, comprising:
a semiconductor substrate;
N conductive layers on the substrate, where N>2; and
N−1 dielectric layers formed between the conductive layers respectively, wherein even numbered ones of the N conductive layers are connected to a first voltage and odd numbered ones of the N conductive layers are set to a second voltage.

2. The ultracapacitor of claim 1, wherein the N conductive layers store a distribution of charge corresponding to a difference between the first and second voltages.

3. The ultracapacitor of claim 1, wherein a uniform charge distribution is stored among the N conductive layers.

4. The ultracapacitor of claim 1, wherein a non-uniform charge distribution is stored among the N conductive layers.

5. The ultracapacitor of claim 1, wherein the N conductive layers have a same width.

6. The ultracapacitor of claim 1, wherein at least two of the N conductive layers have different widths.

7. The ultracapacitor of claim 6, wherein the N conductive layers include at least two adjacent conductive layers that have different widths.

8. The ultracapacitor of claim 1, wherein the N conductive layers include adjacent pairs of conductive layers and wherein the conductive layers in each pair have a same width.

9. The ultracapacitor of claim 8, wherein the widths of the conductive layers in each pair are different from the widths of the conductive layers in every other pair.

10. The ultracapacitor of claim 1, wherein the N conductive layers are equally spaced.

11. The ultracapacitor of claim 1, wherein the N conductive layers are spaced differently.

12. The ultracapacitor of claim 1, wherein the conductive and dielectric layers form a plurality of capacitors connected in parallel.

13. The ultracapacitor of claim 1, wherein the N−1 dielectric layers are at least partially made an oxide of hafnium, and oxide of zirconium, and a barium titanate powder.

14. The ultracapacitor of claim 13, wherein the oxide of hafnium has a dielectric constant k=15, the oxide of zirconium has a k=22, and the barium titanate powder has a k=230.

15. An integrated circuit comprising:
a first ultracapacitor; and
a second ultracapacitor connected in series to the first ultracapacitor, wherein the first and second ultracapacitors each include:
a semiconductor substrate,
N conductive layers on the substrate, where N>2, and N-1 dielectric layers formed between the conductive layers respectively.

16. The circuit of claim 16, wherein the N conductive layers form a plurality of capacitors connected in parallel.

17. A semiconductor die, comprising:
N conductive layers on the substrate, where N>2; and
N-1 dielectric layers formed between the conductive layers respectively,
wherein the conductive and dielectric layers store a charge corresponding to a predetermined voltage, wherein even numbered ones of the N conductive layers are connected to a first voltage and odd numbered ones of the N conductive layers are set to a second voltage.

18. The die of claim 17, wherein the N conductive layers store a distribution of charge corresponding to a difference between the first and second voltages.

19. The die of claim 17, comprising:
wherein the conductive and dielectric layers form a plurality of capacitors connected in parallel.

20. The die of claim 19, wherein the parallel connection of capacitors powers a processor.

21. The die of claim 19, wherein the parallel connection of capacitors is included in one of a processor, a memory, a cache, a chipset, and an interface.

* * * * *